United States Patent [19]

Barraud et al.

[11] Patent Number: 4,925,774

[45] Date of Patent: May 15, 1990

[54] MICROLITHOGRAPHIC PROCESS FOR PRODUCING CIRCUITS USING CONDUCTIVE ORGANIC FILMS SENSITIVE TO ELECTROMAGNETIC RADIATION AND TO CHARGED PARTICLES, AS WELL AS TO THE CIRCUITS AND COMPONENTS OBTAINED BY THIS PROCESS

[75] Inventors: André Barraud, Bures-sur-Yvette; Joël Richard, Trappes; Michel Vandevyver, Chatenay Malabry, all of France

[73] Assignee: Commissariat a l'Energie Atomique, Paris, France

[21] Appl. No.: 172,597

[22] Filed: Mar. 24, 1988

[30] Foreign Application Priority Data

Mar. 24, 1987 [FR] France .................................. 8704075

[51] Int. Cl.$^5$ .............................................. G03C 5/00
[52] U.S. Cl. ................................... 430/296; 430/270; 430/311; 430/945; 430/967; 252/500
[58] Field of Search ............... 430/296, 942, 945, 967, 430/27 D, 311; 252/500, 518

[56] References Cited

U.S. PATENT DOCUMENTS

| | | | |
|---|---|---|---|
| 4,312,935 | 1/1982 | Engler et al. | 430/296 |
| 4,390,586 | 6/1983 | Lemelson | 428/209 |
| 4,535,317 | 8/1985 | Canet et al. | 338/36 |
| 4,613,553 | 9/1986 | Risen et al. | 430/2 |

FOREIGN PATENT DOCUMENTS 2564231 11/1985 France .

OTHER PUBLICATIONS

Physical Review B, vol. 22, No. 12, 15 Dec. 1989, pp. 6035-6043, The American Physical Society; L. Zuppiroli et al.: "Irradiation effects in quasi-one-dimensional organic conductors: The evidence of a transverse fixed-range phonon-assisted hopping".

Primary Examiner—Jose Dees
Attorney, Agent, or Firm—Oblon, Spivak, McClelland, Maier & Neustadt

[57] ABSTRACT

The invention relates to a microlithographic process for producing circuits using organic, conductive films sensitive to electromagnetic radiation and to charged particles.

This process for producing electricity conducting zones on a substrate consists of depositing on said substrate a coating of an electricity conducting, organic compound, such as alkyl pyridinium-tetracyanoquinodimethane and then irradiating certain locations (2,3) of the coating by means of charged particles and/or electromagnetic radiation, so that the irradiated locations become insulating and that on the organic compound coating the electricity conducting zones (1) are directly formed at the desired locations.

4 Claims, 1 Drawing Sheet

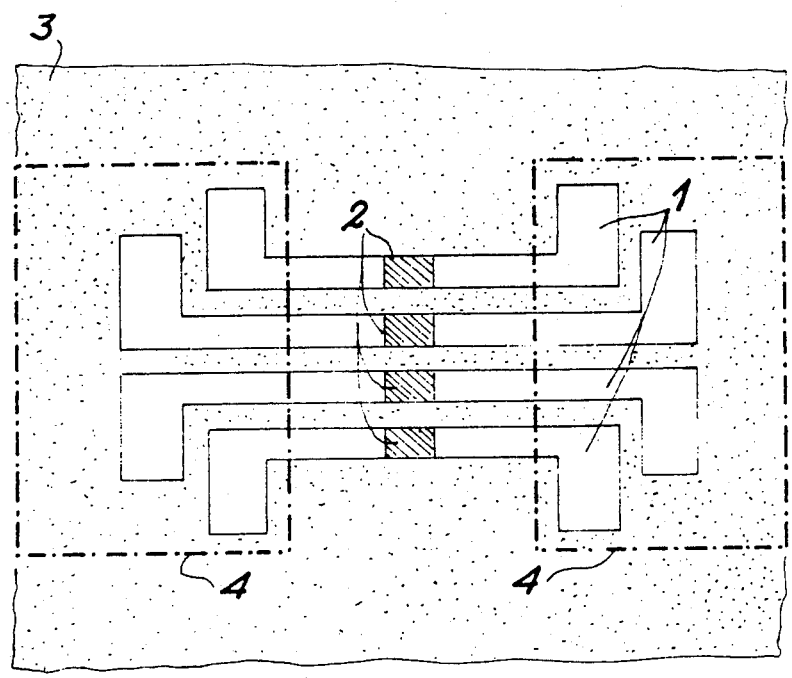

MICROLITHOGRAPHIC PROCESS FOR PRODUCING CIRCUITS USING CONDUCTIVE ORGANIC FILMS SENSITIVE TO ELECTROMAGNETIC RADIATION AND TO CHARGED PARTICLES, AS WELL AS TO THE CIRCUITS AND COMPONENTS OBTAINED BY THIS PROCESS

DESCRIPTION

The present invention relates to a microlithographic process for producing electricity conducting zones using a conductive organic film sensitive to electromagnetic radiation and to charged particles.

In the microelectronics field, use is generally made of microlithographic processes for forming the circuits and electrical connections between the active microelements of the circuit. This is generally brought about by etching a conductive coating previously deposited on the substrate. Thus, in a process of this type, the electricity conducting coating to be etched is firstly deposited, being generally formed by a metal or layer of inorganic semiconductor material. Onto said coating to be etched is then deposited a thin resist film sensitive to electrons or electromagnetic radiation. This resist film is used for forming the design of the circuit to be etched and said design is obtained by irradiating the resist coating with electrons or electromagnetic radiation, e.g. through a mask and by then developing the image obtained by selective dissolving either of the part exposed to radiation (positive resist) or the part not exposed to radiation (negative resist). This makes it possible to expose certain areas of the conductive coating to be etched, which can then be subject to the action either of a chemical bath, or a plasma, or bombardment by reactive ions. At the end of the operation, the residual resist film is eliminated, so as to only retain the electricity conducting zones formed in the initial coating.

In this process, the attainment of the design on the conductive coating is made possible due to the solubility difference between the irradiated and non-irradiated parts of the resist, which makes it possible to eliminate the latter at the desired points and etch the thus exposed conductive coating.

In these processes, the materials used as resists are generally organic, insulating resins and consequently high electrostatic charges are developed on their surface during irradiation. This disadvantage can be obviated by depositing over the resist film a thin carbon or metal film, or by using a resist which is itself electricity conducting and as described in U.S. Pat. Nos. 4 312 935, 4 312 936 and 4 338 392. These patents make use of an organic conductive film of a charge transfer salt for the positive or negative resist. In the case where said salt is used as a positive resist, the film is irradiated by electrons having an adequate energy to bring about the volatilization of the film on the parts exposed to radiation. In the case where it is used as a negative resist, the film is irradiated by means of electrons having an adequate energy to crosslink the zones of the film exposed to the radiation and the non-exposed zones are then eliminated by dissolving in a solvent.

Although these aforementioned patents avoid the deposition of a thin metal film on the resist coating, the definition of the conductive zones still requires the deposition of at least two independent coatings, namely the conductive coating to be etched and the resist film and the process requires a sequence of numerous successive stages as described hereinbefore.

BRIEF DESCRIPTION OF THE DRAWING

Other features and advantages of the invention can be gathered from the study of the following examples given in a non-limitative and illustrative manner with reference to the single drawing, which shows a set of thermistors manufactured in accordance with the process of the invention.

The present invention relates to a microlithographic process making it possible to obviate these disadvantages by eliminating the use of an independent resist film for defining the design of the circuit.

The present invention relates to a process for producing electricity conducting zones on a substrate comprising a stage of defining these zones by a microlithographic process using a photosensitive coating and is characterized in that the photosensitive coating is constituted by a coating of an electricity conducting, organic compound, which can be transformed into an insulating product by irradiation by means of charged particles and/or electromagnetic radiation and in that certain locations of the photosensitive coating of the organic compound are irradiated by means of charged particles and/or electromagnetic radiation, so that the irradiated locations become insulating and consequently the electricity conducting zones are directly formed at the desired locations on the organic compound coating.

Thus, in the process of the invention, the organic compound coating serves both as a photosensitive coating and as a conductive coating to be etched. It is therefore possible to directly obtain by the effect of irradiation alone, the electricity conducting zones at the desired points. Thus, this leads to a considerable simplification of the process for producing these conducting zones by eliminating numerous stages of the conventional microlithography process.

Thus, it is no longer necessary to successively deposit a conductive coating and a photosensitive coating, to eliminate the photosensitive coating at certain points in order to etch the conductive coating, to etch the conductive coating and at the end of the operation to eliminate the remainder of the photosensitive coating. Moreover, this process makes it possible to obtain conductive zones which are not in relief on the substrate, which in numerous cases simplifies the subsequent operations of producing electronic components, e.g. integrated circuit.

According to the invention, it is possible to use any organic electricity conducting component which can become insulating after irradiation by means of charged particles and/or electromagnetic radiation. This compound can in particular be constituted by a charge transfer complex, which conducts electricity. The organic compound coating can be in the form of a thin film obtained by conventional processes, or in the form of a film constituted by at least one monomolecular coating, e.g. obtained by the Langmuir-Blodgets method. In the case where it is desired to use the Langmuir-Blodgett method for preparing the film, it is preferable for the electricity conducting, organic compound to be amphiphilic.

As examples of such amphiphilic compounds, reference can be made to charge transfer complexes complying with the formula: $DA_xX_y$, in which D represents an organic, electron donor group, A represents an organic electron acceptor group, X represents a non-amphiphilic electron acceptor chosen from among the Lewis acids, x is a number greater than zero and y is equal to zero or is a number greater than zero, at least one of the groups D and A being amphiphilic and having at least one saturated or unsaturated hydrocarbon substituent with at least twelve carbon atoms. Generally, x and y can assume values up to 20. Preferably, the hydrocarbon substituent has 14 to 30 carbon atoms. In the above formula, X advantageously represents a Lewis acid chosen from among $I^-$, $I_3^-$, $PF_6^-$, $ClO_4^-$, $BF_4^-$, $ReO_4^-$, $IO_4^-$, $FSO_3^-$, $AsF_6^-$, $AsF_4^-$, $BR^-$, $Cl^-$, and $MnCl_6^-$, Preferably, when y differs from zero, said non-amphiphilic electron acceptor is $I^-$ or $I_3^-$.

According to a preferred embodiment of the invention, the organic electron donor group D is an amphiphilic group having at least one hydrocarbon substituent with at least 12 carbon atoms. In this case, D is advantageously a heterocyclic or aromatic, aliphatic base having at least one saturated or unsaturated hydrocarbon substituent with at least 12 carbon atoms.

Among the aliphatic bases which can be used, reference is made to quaternary ammonium groups of formula:

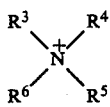

in which $R^3$, $R^4$, $R^5$ and $R^6$, which can be the same or different, are alkyl radicals or hydrocarbon chains optionally having one or more double and/or triple bonds, at least one of the groups $R^3$, $R^4$, $R^5$ and $R^6$ having at least 12 carbon atoms.

The aromatic bases which can be used can be advantageously constituted by quaternary ammonium groups derived from aniline or substituted aniline derivatives.

The heterocyclic bases which can be used can be constituted by quaternary ammonium groups derived from pyridines, piperidines, bipyridines, bipiperidines, benzopyridines, e.g. quinolines, isoquinolines, acridines, phenazines and phenanthrolines. These groups can in particular comply with the following formulas:

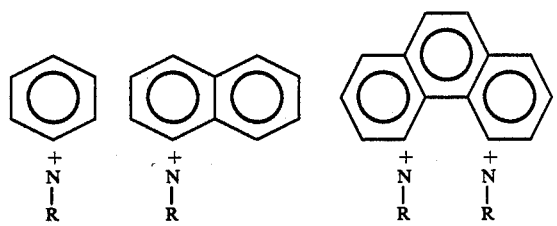

in which the substituent R of the nitrogen atom can be the hydrocarbon radical having more than 12 carbon atoms. This substituent R can also be a hydrogen atom or a lower alkyl radical having e.g. 1 to 4 carbon atoms. In this case, the heterocyclic or benzene nucleus or nuclei have at least one other substituent constituted by a hydrocarbon radical with more than 12 carbon atoms. These nuclei can also have one or more other substituents, such as alkoxy radicals, alkyl radicals, COOR radicals with R representing an alkyl radical, halogen atoms, etc.

The group D can also represent a heterocyclic base having several heteroatoms of different natures, e.g. nitrogen and sulphur atoms. Examples of such heterocyclic bases are N-alkylbenzothiazoles and their substituted derivatives and N-alkylindoleniniumtrimethinecyanines and their substituted derivatives.

It is pointed out that the term "saturated or unsaturated hydrocarbon radical" indicates that the radicals formed from carbon and hydrogen atoms optionally have one or more double and/or triple bonds. The latter can be bonded to the electron acceptor group A and/or to the electron donor group D by a simple bond, an oxygen atom or a —COO— group.

In the amphiphilic complex according to the invention, the electron acceptor group A can be chosen from among tetracyanoethylene (TCNE), hexacyanobutadiene (HCBD), 1,2,4,5-tetracyanobenzene (TCNB), 7,7,8,8-tetracyanoquinodimethane (TCNQ) and the substituted derivatives thereof, tetracyanodiquinodimethane (TCNDQ), benzotetracyanoquinodimethane (benzo-TCNQ), 2,3,5.6-tetrachloro-p-benzoquinone (CA), trinitrobenzene (TNB), tetranaphtoquinodimethane (TNAP), thiophenetetracyanoquinodimethane (thiophene-TCNQ), selenophenetetracyanoquinodimethane (selenophenelCNQ), and tetracyanoquinoquinazolino-quinazoline (TCQQ).

It is also possible to use in the invention substituted derivatives of electron acceptor groups, e.g. halogen derivatives such as fluorine derivatives, alkoxyl derivatives and alkyl derivatives.

Complexes of this type are described in French Patents Nos. 2 564 092 and 564 231.

It is also possible to use in the invention other amphiphilic compounds, e.g. complexes or tetracyanoquinodimethane salts or one of the derivatives thereof. e.g. its fluorine, alkoxyl or alkyl derivatives.

It is also possible to use in the invention organic compounds constituted by charge transfer salts, such as tetrathiafulvalene halogen salts and the alkyl derivatives thereof.

It is also possible to use in the invention charge transfer complexes of tetracyanoquinodimethane and compounds such as tetrathiafulvalene.

The use of amphiphilic compounds in the form of Langmuir-Blodgett films constituted by one or more superimposed monomolecular coatings is particularly advantageous due to the great uniformity and great intrinsic homogeneity of these films, which should not be disturbed by a developing treatment. These films remain homogeneous and without holes for thicknesses below 50 nm.

Furthermore, in view of the fact that the thickness of the sensitive, conductive coating can be very small, the energy of the radiation or charged particles necessary for transforming the film into an insulating product can be low, which leads to a finer outline of the patterns as a result of the smaller enlargement by lateral diffusion and consequently permits a better spatial resolution.

In order to realize the process according to the invention, the first stage consists of depositing the electricity conducting, organic compound coating on an insulating substrate. This can be carried out by conventional methods, e.g. by coating the substrate by means of a solution of the organic compound, by sedimentation or by the Langmuir-Blodgett method.

Preferably, when the organic compound is amphiphilic, the deposition of the coating takes place by forming on the substrate one or more monomolecular coatings using the Langmuir-Blodgett method described in the Journal of Am. Chem. Soc., 57, 1935, pp. 1007-1010.

In certain cases, in order to aid the adhesion of the organic compound coating to the substrate, on said substrate is firstly deposited an adhesion undercoat which can e.g. be constituted by a fatty acid, such as behenic acid or ω-tricosenoic acid, a porphyrin or a phthalocyanin. The deposition of this adhesion subcoat can be carried out as hereinbefore, e.g. by the Langmuir-Blodgett method when the compound used for producing said coating is an amphiphilic compound.

In order to then transform, according to the invention, certain zones of the electricity conducting, organic compound coating into an insulating product, the zones of the coating undergo irradiation by means of charged particles, i.e. ions or electrons, or by means of electromagnetic radiation such as X-rays, ultraviolet rays, gamma rays and the coherent radiation from a laser. The energy and the radiation or irradiation dose applied are chosen in such a way as to simply transform the film into an insulating product without any deterioration thereof, e.g. by evaporation, as is the case described in U.S. Pat. No. 4 312 936. The irradiation dose necessary is in particular dependent on the characteristics of the beam, e.g. its energy, as well as the molecules used for forming the coating and the thickness of said coating. The contrast, i.e. the slope at the inflection point of the exposure curve $d6/dlogD$, in which 6 is the conductivity of the film and D is the dose applied, is also dependent on the molecule used for producing the coating.

The inventive process can in particular be used for producing electricity conducting circuits and electronic components.

The electricity conducting circuits obtained by this process are formed from conductive zones defined by insulating locations and are characterized in that the conductive zones are constituted by an organic compound, such as a charge transfer complex and in that the insulating locations are constituted by the insulating product obtained by the irradiation of said organic compound by means of charged particles and/or electromagnetic radiation.

The invention also relates to the electronic components obtained by this process, which have electricity conducting zones constituted by an electricity conducting organic compound.

EXAMPLE 1

Use of a conductive coating of tetrathiafulvalene(tetracyanoquinodimethane) $_{1.5}$ (TTF-(TCNQ)$_{1.5}$).

The TTF-(TCNQ)$_{1.5}$ complex is firstly prepared by combining the donor and acceptor or by metathesis of the respective salts.

On an alumina substrate is then deposited a thin film of the TTF-(TCNQ)$_{1.5}$ complex by sedimentation from a solution containing $10^{-3}$ mol/l of said complex In a chloroform-acetonitrile mixture with 8 volumes of chloroform for two volumes of acetonitrile. In this way a TTF-(TCNQ)$_{1.5}$ film is obtained with a thickness of 300 nm, which has a conductivity of $1S.cm^{-1}273$ Certain parts of the film then undergo irradiation by means of a programmed electron beam as a function of the design which it is desired to obtain using an irradiation dose of 100 $\mu C.cm^{-2}$ at 5 keV.

Thus, the irradiated Parts of the film are transformed. Following this irradiation, the conductivity of the film on the irradiated parts is reduced by a factor exceeding 100 and thus the electricity conducting circuit is directly obtained with the desired outline.

EXAMPLE 2

Use of a coating of docosylpyridinium tetracyanoquinodimethane (DCP-TCNQ).

In this example, on the substrate produced from fluorine is firstly deposited an adhesion undercoat constituted by three superimposed monomolecular ω-tricosenoic acid coatings. To this end, a solution of $CHCl_3$ containing $10^{-3}$ mol.l$^{-1}$ of ω-tricosenoic acid is prepared and it is dispersed on the surface of the water of a Langmuir cell. The coating is then compressed to 32 mN.m$^{-1}$ and is deposited on an insulating substrate. These operations are repeated so as to deposit on the fluorine substrate three monomolecular ω-tricosenoic acid coatings.

This is followed by the preparation of the amphiphilic complex (DCP-TCNQ) by metathesis from docosylpyridinium iodide and the lithium salt of TCNQ.

The complex obtained is washed and recrystallized. The blue powder of the complex obtained in this way is not conductive. This powder is solubilized in a mixture of chloroform and alcohol with 5% by volume of alcohol, in order to obtain a solution containing $5.10^{-4}$ mol.l$^{-1}$ of the complex and on the surface of a distilled water-filled Langmuir cell is formed a monomolecular coating which is compressed at a pressure of 36 mN.m$^{-1}$. This coating is then transferred to the $CaF_2$ substrate, which has previously been covered with three monomolecular ω-tricosenoic acid coatings, as has been stated hereinbefore.

These operations are repeated to obtain a film formed from 12 superimposed DCP-TCNQ monomolecular coatings on the fluorine substrate. This film is insulating, but iodine is diffused for 15 s at 20° C. which brings about a reorganisation of the coatings and makes the film conductive, the resistivity of the film being 20 Ωcm at 20° C.

The film is then subject to the action of a programmed electron beam as a function of the design which it is wished to obtain to make the film insulating at the desired points. The irradiation dose $D_{50}$ necessary for dividing the conductivity σ of the film by 2 is 30 $\mu C.cm^{-2}$ at 3 keV and the contrast obtained γ (which is defined by the slope at the inflection point of the exposure curve, i.e. curve $d\sigma/dlogD$ with D representing the dose) is between 0.8 and 0.9.

EXAMPLE 3

Use of a film constituted by octadecylpyridinium tetracyanoquinodimethane (ODP-TCNQ).

The charge transfer complex DP-TCNQ is firstly synthesized by hot reacting in an alcoholic solution the octadecylpyridinium iodide with the lithium salt of tetracyanoquinodimethane. After cooling, this gives a powder of the complex, which is washed and recrystallized. This complex is then redissolved in acetonitrile with one equivalent of TCNQ. A black complex crystallizes cold and conducts electricity.

This is followed by the preparation of a solution containing $5.10^{-4}$ mol.l$^{-1}$ of said complex in chloroform and this solution is dispersed on the surface of the water of a Langmuir cell.

In this way a monomolecular coating is formed, which is compressed at a pressure of 26 mN.m$^{-1}$ and is then transferred to an insulating $CaF_2$ substrate by the Langmuir-Blodgett method.

These operations are repeated several times in order to obtain a film formed from six superimposed monomolecular coatings on the fluorine substrate. The resistivity of the thus obtained film is 50 Ω.cm.

The film is exposed to the action of an electron beam with an energy of 3 keV using a mask for defining the design. Thus, the film becomes progressively insulating on the unmasked parts. The dose $D_{50}$ necessary for dividing by two the conductivity of the film is 5 $\mu$C.cm$^{-2}$ and the contrast is equal to 2. It is thus possible to obtain 10 $\mu$m wide insulating lines by irradiating the film with an electron beam at a dose of 50 $\mu$C.cm$^{-2}$.

EXAMPLE 4

Use of a film of octadecyltetracyanoquinodimethane, tetramethyl tetrathiafulvalene (ODTCNQ-TMTTF).

The charge transfer salt ODTCNQ-TMTTF is firstly synthesized by reacting by direct combination the donor and the acceptor.

A solution containing 5.10$^{-4}$ mol.l$^{-1}$ of said complex in CHCL$_3$ is then prepared and said solution is dispersed on the surface of the water of a Langmuir cell. Thus a monomolecular coating is formed, which is compressed at a pressure of 25 mN.m$^{-1}$ and is then transferred to an insulating silica substrate melted by the Langmuir-Blodgett method. This operation is repeated several times to obtain a film with 10 superimposed monomolecular coatings.

The film obtained conducts electricity and has a resistivity of 1 Ω.cm. It is then exposed to a programmed electron beam having an energy of 5 keV, so as to expose to the beam parallel strips of the film With a dose of 100 $\mu$C.cm$^{-2}$, the film is transformed into independent insulating zones separated by conductive strips.

EXAMPLE 5

The same operating procedure as in example 1 is adopted, but instead of subjecting the TTF-(TCNQ)$_{1.5}$ film to irradiation by means of an electron beam, it is subject to irradiation by ultraviolet radiation in air for ten minutes using a 1 kW mercury lamp at 253.65 nm and a metal mask placed against the film. Following irradiation, the film has insulating parts corresponding to the irradiated zones.

EXAMPLE 6

The operating procedure of example 2 is repeated, but the irradiation of the DCP-TCNQ film is carried out under the same conditions as in example 5. In the same way insulating parts on irradiated zones are obtained.

EXAMPLE 7

The operating procedure of example 3 is repeated, but the irradiation of the ODP-TCNQ film takes place under the conditions of example 5. As hereinbefore, insulating parts on irradiated zones are obtained.

EXAMPLE 8

The operating procedure of example 4 is repeated to prepare a conductive film having 10 monomolecular ODTCNQ-TMTTF coatings and said film then undergoes irradiation under the conditions of example 5. Thus, insulating parts on irradiated zones are obtained.

EXAMPLE 9

The operating procedure of examples 1 to 4 is repeated to prepare conductive films and they are exposed to irradiation by the light of a 25 W argon laser tuned to the 514.5 nm line by distributing the light over 5 mm$^2$ and by supplying it to the film through a metal mask giving the design of the circuit. The desired circuit is obtained, which is defined by the insulating zone, after less than one minute of irradiation.

EXAMPLE 10

The operating procedure of examples 1 to 4 is repeated for preparing electricity conducting films. They then undergo irradiation by means of X-rays corresponding to the $K_d$ line of copper using a gold mask corresponding to the design of the circuit. The desired circuit is obtained on all the films by using irradiation doses from 100 mJ.cm$^{-2}$ to 1 J.cm$^{-2}$.

EXAMPLE 11

The operating procedure of example 3 is repeated to prepare an organic conductive film formed from 6 monomolecular coatings of the ODP-TCNQ complex. The film is then exposed to an Ar$^+$ ion beam of energy 50 keV through a mask formed from 0.5 mm wide parallel strips. After receiving a dose of 50 $\mu$C.cm$^{-2}$, the film is transformed into insulating strips separated by conductive strips.

EXAMPLE 12

Production of electronic components.

In this example, a set of thermistors with low thermal inertia, constituted by thin films, is prepared for local measurements of temperature variations produced by visible light radiation.

The charge transfer complex ODP-TCNQ is firstly synthesized following the operating procedure given in example 3. A film constituted by 50 superimposed ODp-TCNQ monomolecular coatings is then deposited on a 10×5×2 mm$^3$ melted silica substrate, whereof it is desired to know the temperature variations at one point, using the same operating procedure as in example 3. The film is then exposed to an electron beam with an energy of 3 keV and programmed so as to obtain the design shown in the attached drawing by using different total irradiation doses on certain zones of the silica substrate covered by the film.

In the attached drawing, it can be seen that zones 1,2 and 3 have been defined on the film during irradiation. Zones 1. left blank, have not been exposed to irradiation, zones 2 in hatched line form have been irradiated at a total dose of 5 $\mu$C/cm$^2$ and zones 3 in dotted line form are zones irradiated at a total dose of 50 $\mu$C/cm$^2$. Thus, the non-irradiated zones 1 have remained electricity conducting, zones 2 have an electrical conductivity divided by 2 and zones 3 are insulating.

Gold contacts with a thickness of 1000 Angstroms are then produced by gold evaporation at the two ends of the thermistors on zones 4 (defined by mixed lines). This gives a set of parallel-connected thermistors.

The resistance R of the set of thermistors is then determined as a function of the temperature T for temperatures between 15 and 50° C. by placing the assembly in a thermostatically controlled enclosure and by measuring the resistance with a Keithley 617A electrometer. The values obtained are given in the following Table 1.

TABLE 1

| T(°C.) | R(MΩ) |
| --- | --- |
| 15 | 5.98 |
| 18 | 5.61 |
| 21 | 5.26 |
| 24 | 4.95 |
| 27 | 4.66 |
| 30 | 4.39 |

TABLE 1-continued

| T(°C.) | R(MΩ) |
|---|---|
| 33 | 4.14 |
| 36 | 3.91 |
| 39 | 3.70 |
| 42 | 3.50 |
| 45 | 3.32 |
| 48 | 3.15 |
| 50 | 3.04 |

The thermistors are placed in the light beam of a visible Cary 2000 spectrophotometer, in such a way that the beam strikes the zones 2, which were previously irradiated at a dose of 5 $\mu C/cm^2$. Under these conditions, temperature variations of 0.5° C. of the silica foil are detected.

EXAMPLE 13

In this example, a set of thermistors with a low thermal inertia and in thin film form is produced for sensing the temperature in a heat regulating process. The operating procedure of example 12 is repeated, but only silica substrate zones 3 are irradiated at a dose of 50 $\mu C/cm^2$. Thus, the zones 2 have the initial conductivity of the ODP-TCNQ film.

As in example 12, the resistance R of the set of thermistors is then determined as a function of the temperature T for temperatures between 5 and 26° C. using a thermostatically controlled enclosure and a Keithley 617 A electrometer. The results obtained are given in the following Table 2:

TABLE 2

| T(°C.) | R(MΩ) |
|---|---|
| 5 | 4.49 |
| 8 | 4.19 |
| 11 | 3.91 |
| 14 | 3.66 |
| 17 | 3.43 |
| 20 | 3.22 |
| 23 | 3.03 |
| 26 | 2.85 |

The set of thermistors is then used in the following way. The melted silica substrate is bonded to the inner wall of a copper enclosure of dimensions $10 \times 10 \times 10$ cm$^3$, whereof it is desired to regulate the temperature to 15° C.±0.7° C. by means of a cold air circulation and a heating resistor of 10Ω and 50 W. The set of thermistors used as a heat sensor is inserted in the chain of temperature regulating reactions and is supplied by a constant current. The variations of the resistance of the thermistors are thus transformed into voltage variations at the terminals thereof. It is thus possible to regulate the temperature of the enclosure to 15° C. with an accuracy of +0.5° C.

We claim:

1. Process for producing electrically conducting zones on a substrate, comprising defining these zones by a microlithographic process using a photosensitive coating comprising an electrically conducting, organic compound, which can be transformed into an insulating product by irradiation by means of charged particles and/or electromagnetic radiation, irradiating certain locations of the photosensitive coating of the organic compound other than the locations defining the electrically conducting zones by means of charged particles and/or electromagnetic radiation, so that the irradiated locations become insulating and directly forming the electrically conducting zones at the desired locations on the organic compound coating characterized in that the organic compound is a salt or a complex of tetracyanoquinodimethane or one of its derivatives.

2. Process for producing electrically conducting zones on a substrate, comprising defining these zones by a microlithographic process using a photosensitive coating comprising an electrically conducting, organic compound, which can be transformed into an insulating product by irradiation by means of charged particles and/or electromagnetic radiation, irradiating certain locations of the photosensitive coating of the organic compound other than the locations defining the electrically conducting zones by means of charged particles and/or electromagnetic radiation, so that the irradiated locations become insulating and directly forming the electrically conducting zones at the desired locations on the organic compound coating characterized in that the organic compound is tetrathiafulvalene-(tetracyanoquinodimethane)$_{1.5}$.

3. Process for producing electrically conducting zones on a substrate, comprising defining these zones by a microlithographic process using a photosensitive coating comprising an electrically conducting, organic compound, which can be transformed into an insulating product by irradiation by means of charged particles and/or electromagnetic radiation, irradiating certain locations of the photosensitive coating of the organic compound other than the locations defining the electrically conducting zones by means of charged particles and/or electromagnetic radiation, so that the irradiated locations become insulating and directly forming the electrically conducting zones at the desired locations on the organic compound coating characterized in that the organic compound is an electrically conducting charge transfer complex or salt chosen from the group consisting of docosylpyridiniumtetracyanoquinodimethane, octadecylpyridiniumtetracyanoquinodimethane and octadecyltetracyanoquinodimethane-tetramethyltetrathiafulvalene.

4. Process according to claim 3, characterized in that the organic compound coating is constituted by at least one monomolecular coating of an amphiphilic, electrically conducting, organic compound.

* * * * *